(12) United States Patent
Lin et al.

(10) Patent No.: US 12,171,095 B2
(45) Date of Patent: Dec. 17, 2024

(54) MEMORY STRUCTURE

(71) Applicant: Winbond Electronics Corp., Taichung (TW)

(72) Inventors: Shih-Chieh Lin, Chiayi County (TW); Shuen-Hsiang Ke, Changhua County (TW)

(73) Assignee: Winbond Electronics Corp., Taichung (TW)

( * ) Notice: Subject to any disclaimer, the term of this patent is extended or adjusted under 35 U.S.C. 154(b) by 393 days.

(21) Appl. No.: 17/689,014

(22) Filed: Mar. 8, 2022

(65) Prior Publication Data

US 2022/0189964 A1 Jun. 16, 2022

Related U.S. Application Data

(62) Division of application No. 16/884,914, filed on May 27, 2020, now Pat. No. 11,315,932.

(51) Int. Cl.
| | |
|---|---|
| *H01L 23/48* | (2006.01) |
| *H01L 29/40* | (2006.01) |
| *H10B 12/00* | (2023.01) |

(52) U.S. Cl.
CPC ........... *H10B 12/482* (2023.02); *H10B 12/50* (2023.02)

(58) Field of Classification Search
CPC .............................. H10B 12/482; H10B 12/50

USPC .......................................................... 257/773
See application file for complete search history.

(56) References Cited

U.S. PATENT DOCUMENTS

| | | | |
|---|---|---|---|
| 6,699,746 B2 | 3/2004 | Chung et al. | |
| 8,404,554 B2 | 3/2013 | Ema et al. | |
| 8,809,162 B2 | 8/2014 | Lee et al. | |
| 8,906,763 B2 | 12/2014 | Park et al. | |
| 9,450,034 B2 | 9/2016 | Lee et al. | |
| 2006/0270146 A1* | 11/2006 | Tegen ................ | H10B 12/0335 257/300 |
| 2018/0122809 A1 | 5/2018 | Lin | |
| 2021/0082924 A1* | 3/2021 | Seong ................ | H10B 12/482 |

* cited by examiner

*Primary Examiner* — Theresa T Doan
(74) *Attorney, Agent, or Firm* — MUNCY, GEISSLER, OLDS & LOWE, P.C.

(57) ABSTRACT

A memory structure includes: a substrate including a memory array region and a peripheral circuit region; a plurality of bit line structures disposed in the memory array region of the substrate; a dummy bit line structure disposed on the substrate, wherein the dummy bit line structure is disposed in the memory array region and immediately adjacent to the peripheral circuit region; a plurality of contacts disposed between the bit line structures and in the memory array region; a dielectric layer disposed on the substrate and in the peripheral circuit region; and a protective structure disposed in the memory array region and immediately adjacent to the peripheral circuit region, wherein the protective structure includes the dummy bit line structure and a top surface of the protective structure is higher than top surfaces of the bit line structures.

17 Claims, 7 Drawing Sheets

MEMORY STRUCTURE

CROSS REFERENCE TO RELATED APPLICATIONS

This application is a divisional application of U.S. application Ser. No. 16/884,914, filed on May 27, 2020, entitled "MEMORY STRUCTURE AND METHOD FOR FORMING THE SAME", which is hereby incorporated herein by reference.

BACKGROUND

Technical Field

The disclosure relates to a memory structure, and more particularly to a dynamic random access memory structure and method for forming the same.

Description of the Related Art

The manufacturing of a dynamic random access memory device includes forming metal oxide semiconductor (MOS) transistors and contacts on a substrate, followed by forming capacitors on the contacts. The capacitors are electrically connected to the substrate and the metal oxide semiconductor transistors through the contacts. However, during the formation of the capacitors, it is usually necessary to design an additional mask to form a protective ring structure between the memory array region and the peripheral circuit region to prevent the acid liquid used in the subsequent process from penetrating into the memory array region.

Although the existing memory structures and manufacturing methods generally meet the needs, they are not satisfactory in all aspects. Therefore, it is still necessary to improve the manufacturing methods of the dynamic random access memory device to overcome the problems caused by the scaling down of the device and enhance the reliability of the device.

SUMMARY

Embodiments of the present disclosure provide a method for forming a memory structure including: providing a substrate including a memory array region and a peripheral circuit region; forming a plurality of bit line structures in the memory array region of the substrate; forming a dielectric layer in the peripheral circuit region of the substrate; forming a plurality of contacts between the bit line structures, wherein the top surfaces of the contacts are lower than the top surfaces of the bit line structures; depositing a protective layer on the substrate, wherein the first top surface of a portion of the protective layer in the memory array region is lower than the second top surface of a portion of the protective layer in the peripheral circuit region; depositing a hard mask layer on the protective layer; etching back the hard mask layer to form a hard mask spacer on the first top surface of the protective layer and immediately adjacent to the peripheral circuit region; and etching the protective layer with the hard mask spacer as an etching mask to leave a protective feature at the boundary between the memory array region and the peripheral circuit region.

Embodiments of the present disclosure provide a memory structure including: a substrate, a plurality of bit line structures, a dummy bit line structure, a plurality of contacts, a dielectric layer, and a protective structure. The substrate includes a memory array region and a peripheral circuit region. The bit line structures are disposed in the memory array region of the substrate. The dummy bit line structure is disposed on the substrate, wherein the dummy bit line structure is disposed in the memory array region and immediately adjacent to the peripheral circuit region. The contacts are disposed between the bit line structures and in the memory array region. The dielectric layer is disposed on the substrate and in the peripheral circuit region. The protective structure is disposed in the memory array region and immediately adjacent to the peripheral circuit region, wherein the protective structure includes a dummy bit line structure and the top surface of the protective structure is higher than top surfaces of the bit line structures.

BRIEF DESCRIPTION OF THE DRAWINGS

Aspects of this disclosure are best understood from the following detailed description when read with the accompanying figures. It should be noted that, in accordance with common practice in the industry, various features are not drawn to scale. In fact, the dimensions of the various features may be arbitrarily increased or reduced for clarity of discussion.

DETAILED DESCRIPTION

Figure 1:
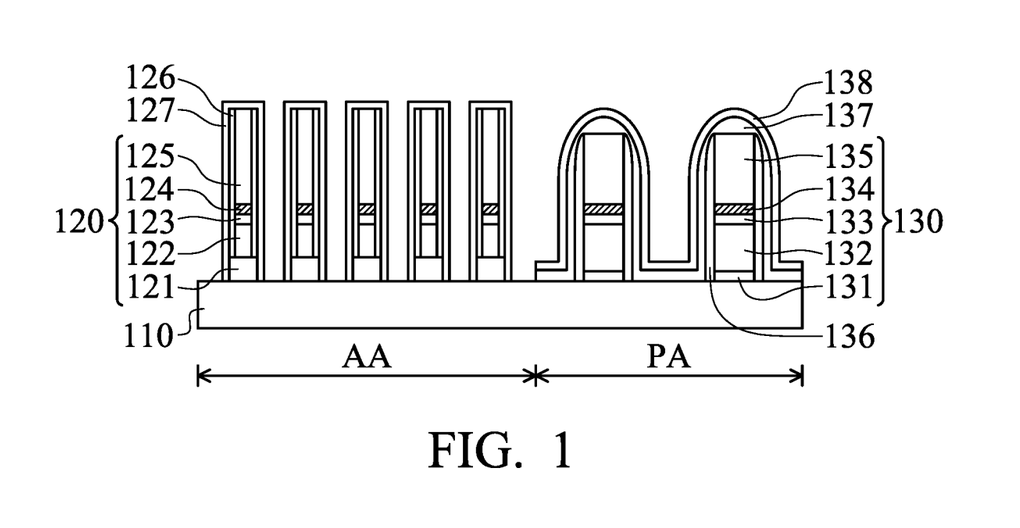
FIGS. 1 to 9 illustrate the cross-sectional view of the memory structure at different stages for forming the same according to some embodiments of the present disclosure.
Figure 7:
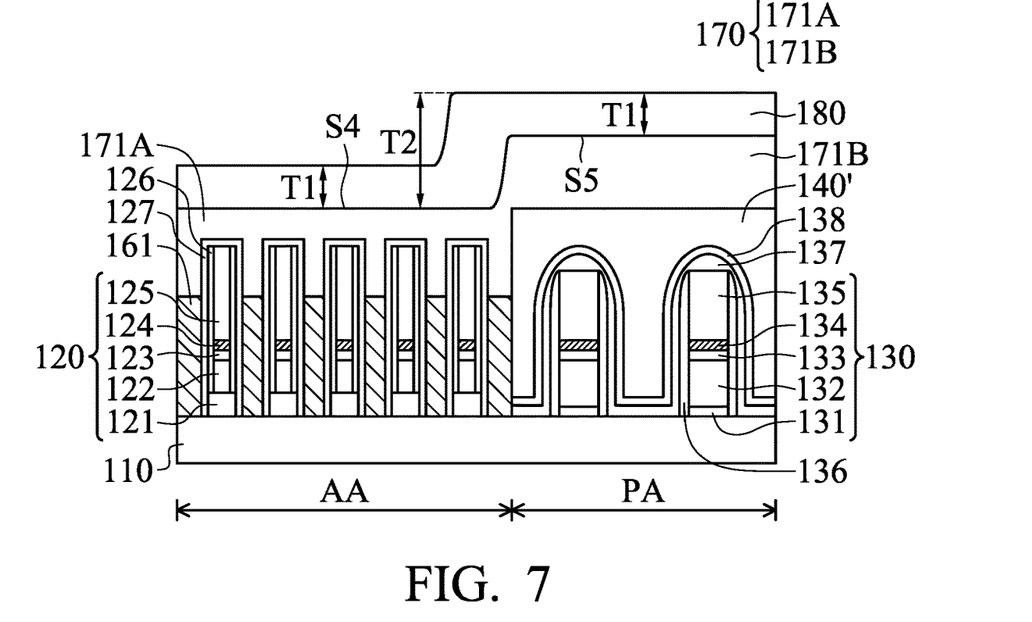
Figure 8:
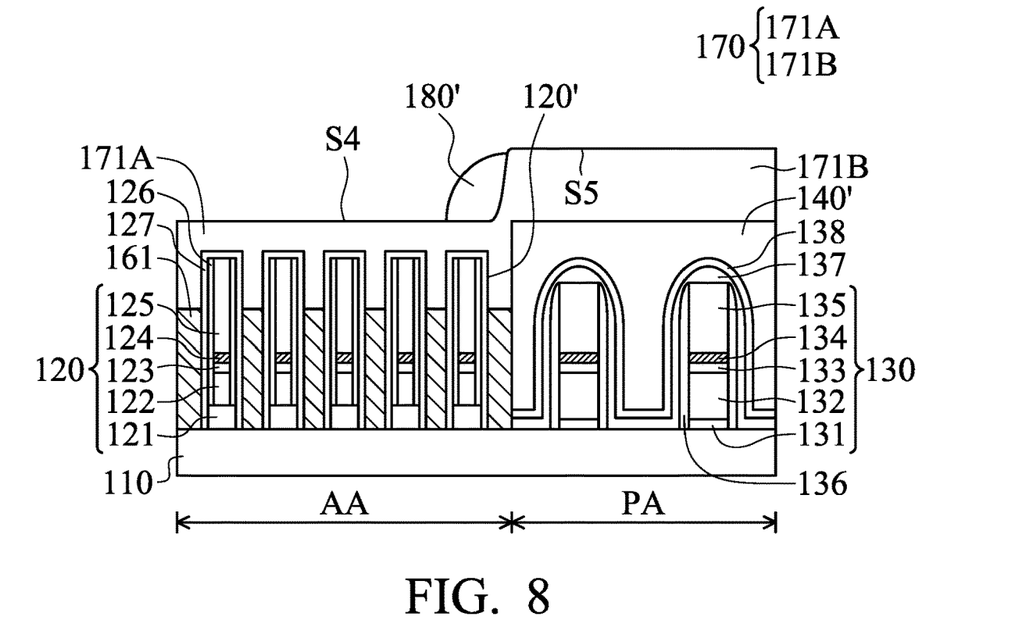
Figure 9:
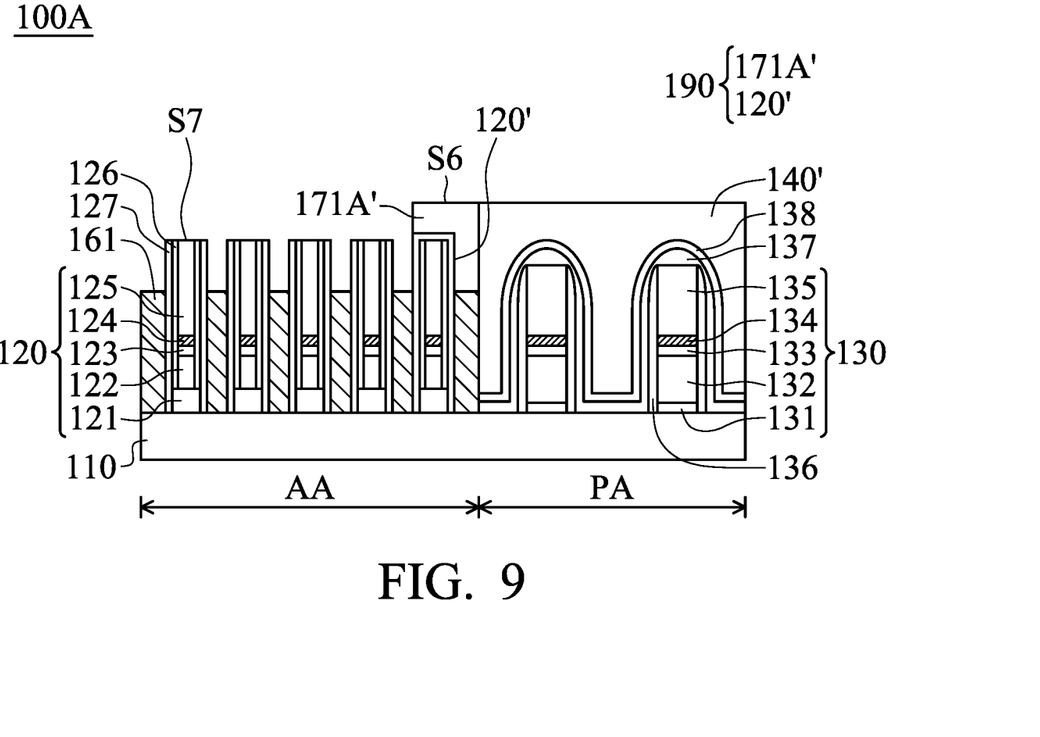

FIGS. 1 to 8 illustrate the cross-sectional view of the memory structure at different stages for forming the memory structure 100A shown in FIG. 9 according to some embodiments of the present disclosure. Referring to FIG. 1, a substrate 110 includes a memory array region AA including a plurality of bit line structures 120 and a peripheral circuit region PA including a plurality of peripheral bit line structures 130. In accordance with some embodiments of the present disclosure, the peripheral bit line structures 130 disposed in the peripheral circuit region PA are used to transmit signals between the bit line structures 120 disposed in the memory array area AA and an external circuit (not shown) such as a logic circuit so that the external circuit may operate (for example, read, write, or erase) devices in the memory array region AA. In order to simplify the figures and highlight the features of the present disclosure, structures other than the bit line structures are not shown, such as metal oxide semiconductor transistors, word line structures, and/or contacts.

In some embodiments, the substrate 110 may be a semiconductor substrate such as silicon substrate. In other embodiments, the semiconductor substrate described above may be elemental semiconductor including germanium; compound semiconductor including gallium nitride (GaN), silicon carbide (SiC), gallium arsenide (GaAs), gallium phosphide (GaP), indium phosphide (InP), indium arsenide (InAs) and/or indium antimonide (InSb). In other embodiments, the substrate 110 may be a semiconductor-on-insulator substrate. The semiconductor-on-insulator substrate may include a bottom substrate, a buried oxide disposed on the bottom substrate, and a semiconductor layer disposed on the buried oxide.

In some embodiments, the bit line structure 120 includes a dielectric layer 121, a mask layer 122, a barrier layer 123, a bit line 124, and a capping layer 125 from bottom to top. A dielectric layer 126 covers the sidewalls of the mask layer 122, the barrier layer 123, the bit line 124, and the capping layer 125. A dielectric layer 127 covers the sidewalls of the dielectric layer 121, the dielectric layer 126, and the top surface of the capping layer 125.

In some embodiments, the dielectric layer 121 may be formed of an oxide such as a silicon oxide layer formed of tetraethylorthosilicate (TEOS). In other embodiments, the dielectric layer 121 may also include other dielectric materials such as silicon nitride, silicon oxynitride, phosphosilicate glass (PSG), borophosphosilicate glass (BPSG), low dielectric constant dielectric materials, and/or other suitable dielectric materials. In some embodiments, the materials of the mask layer 122 may include silicon nitride (SiN) and polysilicon.

In some embodiments, the material of the barrier layer 123 may include a barrier metal material such as titanium nitride (TiN). The material of the bit line 124 may include polysilicon or a metal material such as tungsten (W). The barrier layer 123 and the bit line 124 may be formed by chemical vapor deposition (CVD), physical vapor deposition (PVD), or atomic layer deposition (ALD), respectively.

In some embodiments, the material of the capping layer 125 may include silicon nitride. In some embodiments, the material of the dielectric layer 126 may include nitride such as silicon nitride, and the material of the dielectric layer 127 may include oxide such as silicon oxide. In other embodiments, the materials of the dielectric layers 126 and 127 may also be selected from the dielectric materials used to form the dielectric layer 121. Therefore, it is not repeated again herein. In accordance with some embodiments of the present disclosure, the dielectric layer 121, mask layer 122, capping layer 125, dielectric layer 126, and dielectric layer 127 may be formed by deposition processes such as chemical vapor deposition, atomic layer deposition, and/or a combination thereof.

In some embodiments, the peripheral bit line structure 130 includes a dielectric layer 131, a mask layer 132, a barrier layer 133, a peripheral bit line 134, and a capping layer 135 from bottom to top. A dielectric layer 136 covers the sidewalls of the dielectric layer 131, the mask layer 132, the barrier layer 133, the peripheral bit line 134, and the capping layer 135. Dielectric layers 137 and 138 sequentially cover the sidewalls of the dielectric layer 136 and the top surface of the capping layer 135.

In accordance with some embodiments of the present disclosure, the materials and forming methods of the dielectric layer 131, the mask layer 132, the barrier layer 133, the peripheral bit line 134, and the capping layer 135 included in the peripheral bit line structure 130 may be selected from those of the dielectric layer 121, the mask layer 122, the barrier layer 123, the bit line 124, and the capping layer 125 included in the bit line structure 120, respectively. Therefore, it is not repeated again herein.

In some embodiments, the materials and forming methods of the dielectric layers 136, 137, 138 may also be selected from the dielectric materials and forming methods for forming the dielectric layer 121 described above. Therefore, it is not repeated again herein. In some embodiments, the material of the dielectric layer 136 may include nitride such as a silicon nitride, the material of the dielectric layer 137 may include oxide such as a silicon oxide, and the material of the dielectric layer 138 may include nitride such as a silicon nitride.

Figure 2:
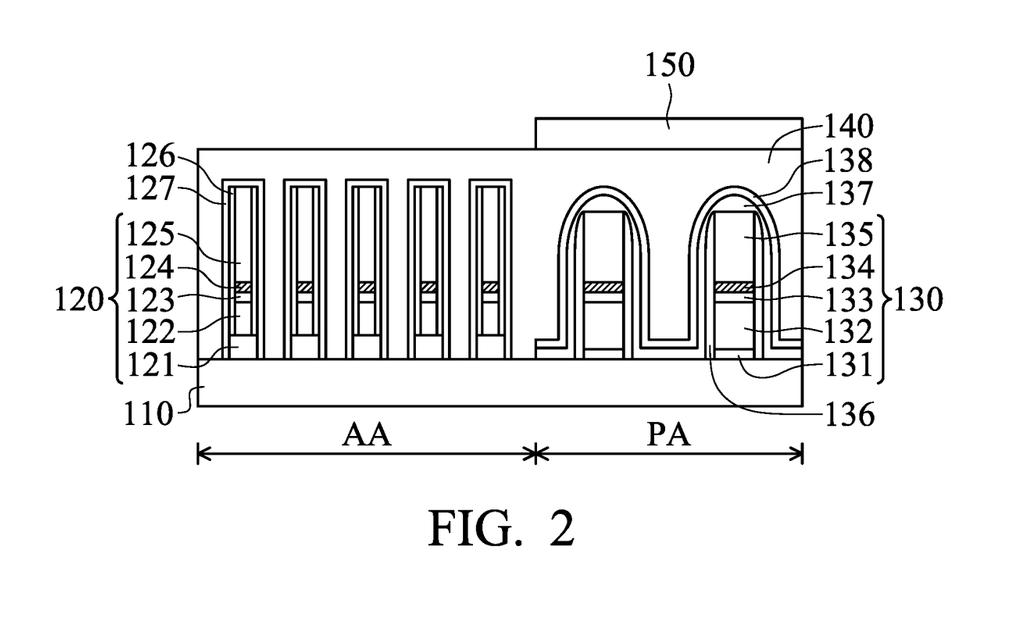

Referring to FIG. 2, a dielectric layer 140 is formed on the substrate 110 to cover the memory array region AA and the peripheral circuit region PA. Then, an etching mask 150 is formed to cover the peripheral circuit region PA. Next, a portion of the dielectric layer 140 covering the memory array region AA (e.g., the portion of dielectric layer 140 not covered by the etching mask 150) is removed by an etching process.

In some embodiments, the dielectric layer 140 may be formed of an oxide such as a silicon oxide layer formed of TEOS. In other embodiments, the dielectric layer 140 may also include a single or multiple layers selected from one or more of the dielectric materials used to form the dielectric layer 121 described above. Therefore, it is not repeated again herein. The etching process described above may be a wet etching process, a dry etching process, other suitable etching process, or a combination thereof.

In some embodiments, the etching chemicals used in the wet etching process described above may include a diluted hydrofluoric acid solvent having, for example, ammonium fluoride ($NH_4F$), diluted hydrofluoric acid ($HF/H_2O$), or a combination thereof as a buffer. In some embodiments, the etching chemicals used in the dry etching process described above may include fluorocarbon-based chemicals such as fluorinated hydrocarbons, tetrafluoromethane ($CF_4$), trifluoromethane ($CHF_3$), and similar compounds.

Figure 3:
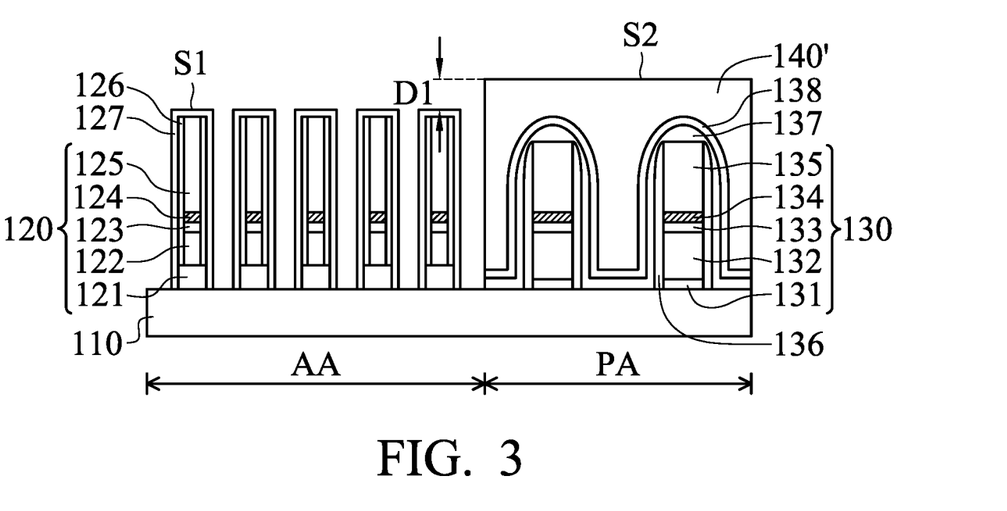

Referring to FIG. 3, the dielectric layer 140' in the peripheral circuit region PA and covering the peripheral bit line structure 130 remains after the etching process described above. In accordance with some embodiments of the present disclosure, the bit line structure 120 in the memory array region AA has a top surface S1 and the dielectric layer 140' in the peripheral circuit region PA has a top surface S2. The top surface S2 is higher than the top surface S1. The distance D1 between the top surface S2 and the top surface S1 is between 10 nm to 150 nm, such as 20 nm.

Figure 4:
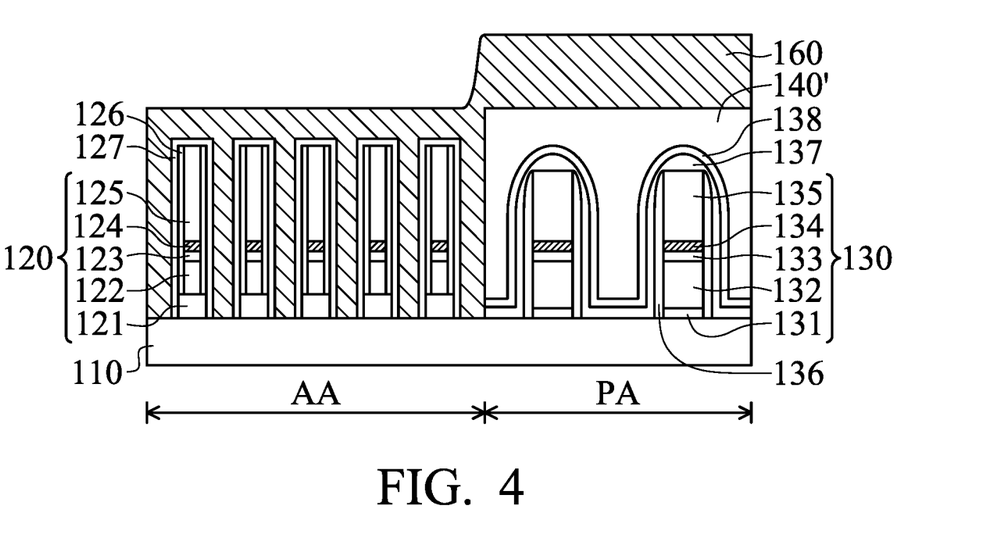

Referring to FIG. 4, a conductive material 160 is deposited on the substrate 110 and filled between the bit line structures 120. According to some embodiments of the present disclosure, the conductive material 160 may include polysilicon and may be formed by chemical vapor deposition. In other embodiments, the conductive material 160 may include metal or metal nitride. For example, the metal may be tungsten (W), aluminum (Al), copper (Cu), and the metal nitride may be tungsten nitride (WN), titanium nitride (TiN), or tantalum nitride (TaN). The conductive material 160 may be formed by chemical vapor deposition, physical vapor deposition, or atomic layer deposition.

Figure 5:
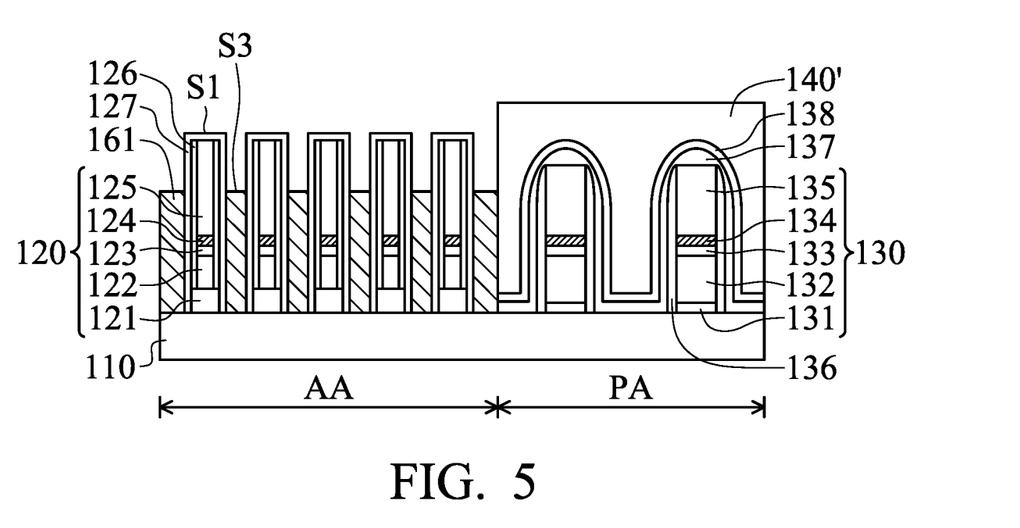

Referring to FIG. 5, the conductive material is etched back to form a plurality of contacts 161 after the deposition of the conductive material 160. The top surface S3 of the contact 161 is lower than the top surface S1 of the bit line structure 120. In some embodiments, the etching back process described above may be a dry etching process using, for example, HBr as an etchant. In other embodiments, the etching back process described above may be a wet etching process using, for example, HNO3/HF as an etchant.

Figure 6:
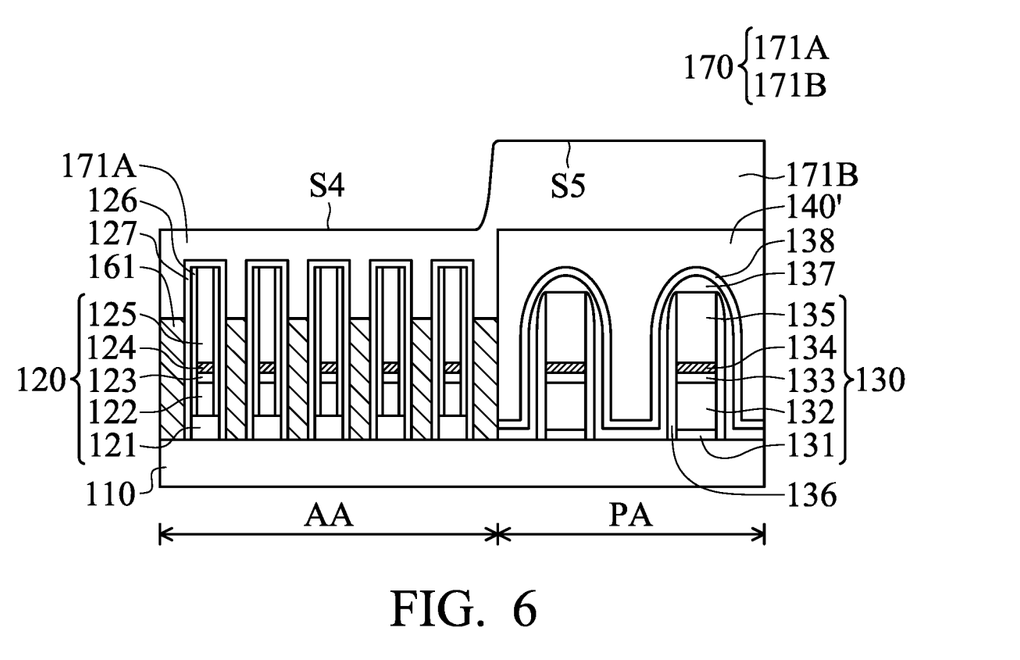

Referring to FIG. 6, a protective layer 170 is deposited on the substrate 110 to cover the bit line structures 120 and the contacts 161 disposed in the memory array region AA and the dielectric layer 140' disposed in the peripheral circuit region PA. The first portion of the protective layer 171A disposed in the memory array region AA has a top surface S4, and the second portion of the protective layer 171B disposed in the peripheral circuit region PA has a top surface S5. The top surface S4 is lower than the top surface S5 so that a step height is formed at the boundary between the memory array region AA and the peripheral circuit region PA. According to some embodiments of the present disclosure, the step height described above (e.g., the distance between the top surfaces S4 and S5) may be adjusted by changing the thickness of the dielectric layer 140' or the distance D1 between the top surface S2 of the dielectric layer 140' and the top surface S1 of the bit line structure 120. Specifically, the greater the thickness of the dielectric layer 140', the greater the distance D1, and the greater the step.

Referring to FIG. 7, a hard mask layer 180 is deposited on the protective layer 170. In some embodiments, the hard mask layer 180 may be deposited on the protective layer 170 by a spin-on coating process. The hard mask layer 180 may include a carbon-based material such as spin-on carbon or other material similar to carbon-based material. The hard mask layer 180 with a thicker thickness may be formed at the boundary between the memory array region AA and the peripheral circuit region PA by the spin-on coating process described above. Specifically, the hard mask layer 180 at the boundary has a thickness T2, which is greater than the thickness T1 of the hard mask layer 180 at other locations away from the boundary.

Referring to FIG. 8, the hard mask layer 180 is etched back so that a hard mask spacer 180' is formed on the top surface S4 of the first portion of the protective layer 171A and is immediately adjacent to the peripheral circuit region PA. The hard mask spacer 180' covers at least one bit line structure 120 adjacent to the peripheral circuit region PA. In some embodiments, the bit line structure 120 covered by the hard mask spacer 180' may be a dummy bit line structure (e.g., a dummy bit line structure 120'). In some embodiments, the etching back process described above may be a dry etching process which chlorine gas ($Cl_2$), tetrafluoromethane ($CF_4$), or trifluoromethane ($CHF_3$) is used as an etchant, for example.

It should be noted that although the hard mask spacer 180' shown in FIG. 8 completely covers the top surface of the dummy bit line structure 120', the embodiments of the present disclosure are not limited thereto. In other embodiments, the hard mask spacer 180' may also be adjusted to partially cover the top surface of the dummy bit line structure 120' (not shown) according to product design.

In other embodiments, the process of depositing the hard mask layer 180 on the protective layer 170 as shown in FIG. 7 may also include a chemical vapor deposition process. The hard mask layer 180 may include a dielectric material selected from that of the dielectric layer 121 described above, such as a silicon oxide layer formed by tetraethoxysilane (TEOS), silicon nitride, silicon oxynitride, and phosphor-silicate glass (PSG), borophosphosilicate glass (BPSG), low dielectric constant dielectric material, and/or another suitable dielectric material. Next, an etching process is performed on the hard mask layer 180 to form the hard mask spacer 180' as shown in FIG. 8. It is appreciated that in the process of depositing the hard mask layer 180 on the protective layer 170, the hard mask layer 180 formed by the spin-on coating process is thicker than the hard mask layer 180 formed by the chemical vapor deposition process. Furthermore, the thicker hard mask layer 180 (the hard mask layer 180 having the thickness T2 shown in FIG. 7) having a larger coverage range may be formed at the boundary by the spin-on coating process.

Referring to FIG. 9, the protective layer 170 is etched with the hard mask spacer 180' as an etching mask so that a protective feature 171A' having acid resistance is left at the boundary between the memory array region AA and the peripheral circuit region PA. As shown in FIG. 9, the protection feature 171A' covers at least one of the bit line structures 120 (e.g., the dummy bit line structure 120') immediately adjacent to the peripheral circuit region PA. The protection feature 171A' disposed between the dummy bit line structure 120' and the dielectric layer 140' together with the dummy bit line structure 120' covered by protection feature 171A' serve as a protective structure 190.

In the embodiment shown in FIG. 9, an etching rate of the protective layer 170 is higher than that of the hard mask spacer 180'. The protective layer 170 may be etched with a high selective etching ratio of the protective layer 170 to the hard mask spacer 180'. For example, the etching rate ratio of the protective layer 170 to the hard mask spacer 180' is between 2 to 5. The second portion of the protective layer 171B and the first portion of the protective layer 171A not covered by the hard mask spacer 180' are removed and the protective feature 171A' remains. As shown in FIG. 9, the top surface S6 of the protective structure 190 (or the protective feature 171A') of the memory structure 100A is higher than the top surface S7 of the bit line structure 120 and the top surface of the dummy bit line structure 120'. It should be noted that since the bit line structure 120 and the protective layer 170 also have a high etching selective ratio, an etching rate of the protective layer 170 is higher than that of the bit line structure 120 so that the top surface S7 of the bit line structure 120 may be slightly lower than or substantially the same as the top surface S1 of the bit line structure 120 (as shown in FIG. 3) after etching the protective layer 170.

According to some embodiments of the present disclosure, it can effectively prevent the acid liquid used to remove the excess film layer in the subsequent process (e.g., the hydrofluoric acid used to remove the excess dielectric layer between capacitors after forming capacitors on contacts) from penetrating into the memory array region AA by disposing the top surface S6 of the protective structure 190 higher than the top surface S7 of the bit line structure 120. Therefore, the reliability of the memory structure 100A is improved. The hard mask spacer 180' is formed at the boundary between the memory array region AA and the peripheral circuit region PA. Then, the protective structure 190 having acid resistance is formed with the high etching selective ratio. There is no need to design an additional mask to form a protective ring structure, which can effectively improve the process yield and reduce production costs.

Figure 10:
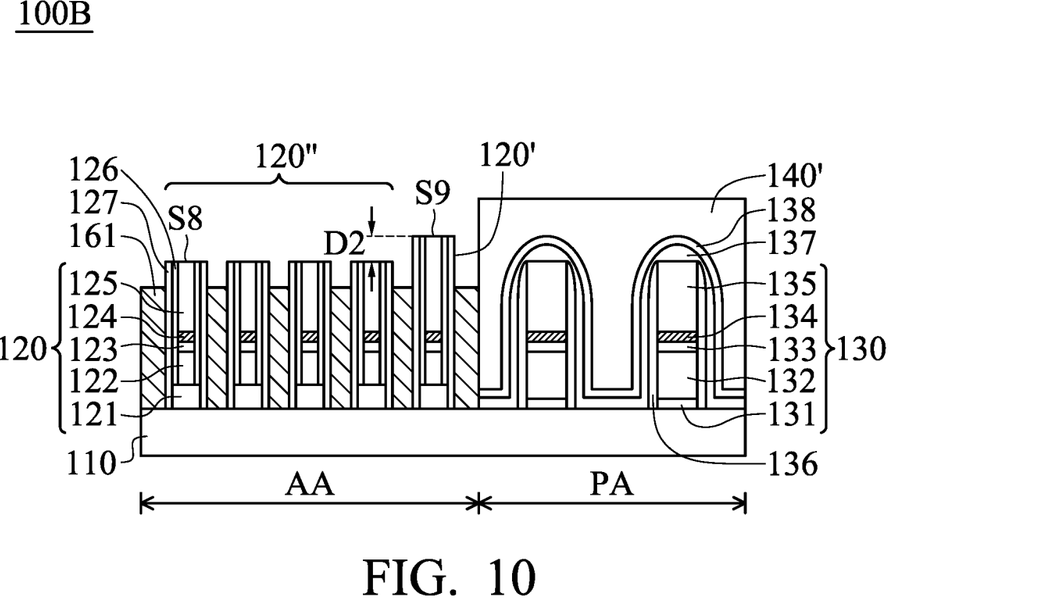
FIG. 10 illustrates the cross-sectional view of the memory structure following the formation stage shown in FIG. 8 according to other embodiments of the present disclosure.

On the other hand, referring to FIG. 10 together with FIG. 8, in other embodiments, the protective layer 170 may be etched with a low selective etching ratio of the protective layer 170 to the hard mask spacer 180'. For example, the etching rate ratio of the protective layer 170 to the hard mask spacer 180' is between 0.5 to 2. In the etching process of the protective layer 170 shown in FIG. 10, since the bit line structure 120 and the protective layer 170 also have a low etching selectivity, the bit line structure 120 may be etched simultaneously. The top surface S8 of the bit line structure 120 (e.g., the bit line structure 120") not covered by the hard mask spacer 180' is lower than the top surface S9 of at least one of the bit line structures 120 (e.g., the dummy bit line structure 120') immediately adjacent to the peripheral circuit region PA. In some embodiments, a distance D2 between the top surface S8 of the bit line structure 120" and the top surface S9 of the dummy bit line structure 120' is between 5 nm to 15 nm, such as 10 nm.

It should be noted that, in the etching process of the protective layer 170 shown in FIG. 10, since the bit line structure 120' has a dielectric layer 127 (e.g. including silicon oxide) overlying the capping layer 125, the consumption of the bit line structure 120' in the etching process is smaller than that of the protective layer 170. Furthermore, the top surface S9 of the bit line structure 120'may be slightly lower than or substantially the same as the top surface S1 of the bit line structure 120 (as shown in FIG. 3) after etching the protective layer 170.

According to the embodiment shown in FIG. 10, in the memory structure 100B, the dummy bit line structure 120' immediately adjacent to the peripheral circuit region PA may serve as the protection structure. It can effectively prevent the acid liquid (e.g., the hydrofluoric acid) used to remove the excess film layer in the subsequent process from penetrating into the memory array region AA by disposing the top surface S9 of the dummy bit line structure 120' higher than the top surface S8 of the bit line structure 120". Therefore, the reliability of the memory structure 100B is improved. The hard mask spacer 180' is formed at the boundary between the memory array region AA and the peripheral circuit region PA. Then, the dummy bit line structure having the top surface higher than that of the bit line structure is formed with the low etching selective ratio. There is no need to design an additional mask to form a protective ring structure, which can effectively improve the process yield and reduce production costs.

Figure 11:
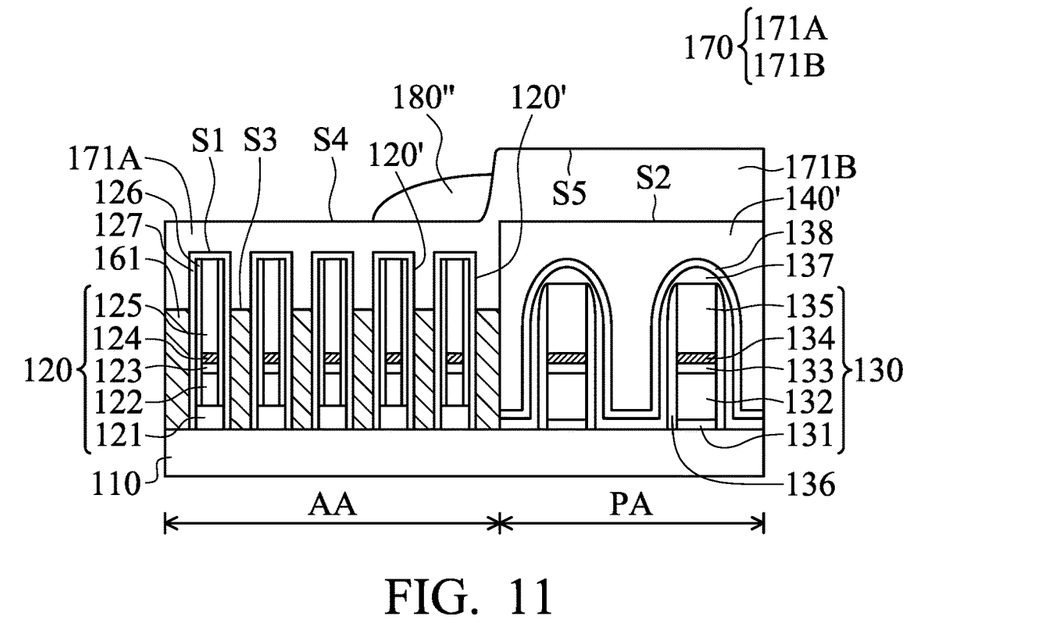
FIG. 11 illustrates the cross-sectional view of the memory structure following the formation stage shown in FIG. 7 according to yet other embodiments of the present disclosure.
Figure 12:
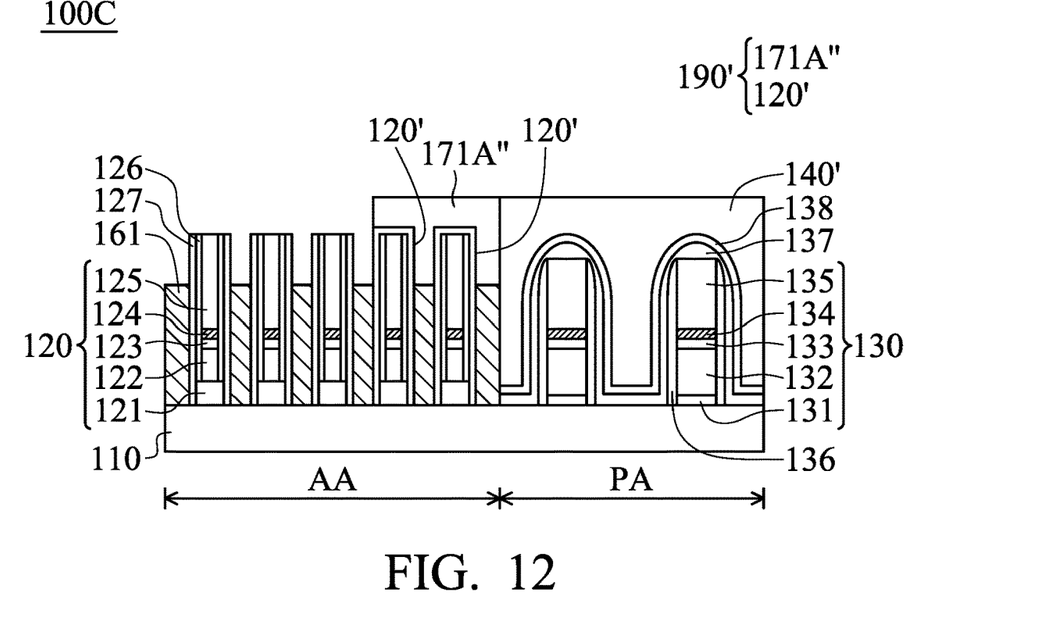
FIG. 12 illustrates the cross-sectional view of the memory structure following the formation stage shown in FIG. 11 according to some embodiments of the present disclosure.
Figure 13:
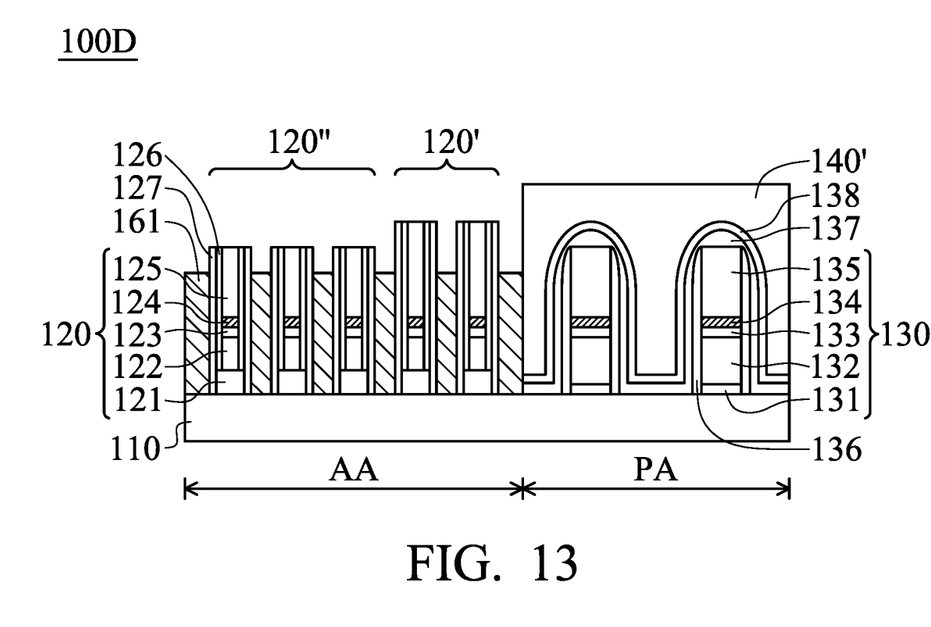
FIG. 13 illustrates the cross-sectional view of the memory structure following the formation stage shown in FIG. 11 according to other embodiments of the present disclosure.

According to other embodiments of the present disclosure, FIGS. 11 to 13 illustrate the cross-sectional view of the memory structure 100C and 100D at different stages for forming the same. FIG. 11 may continue subsequent to the formation stage of the memory structure shown in FIG. 7. FIGS. 12 and 13 may continue subsequent to the formation stage of the memory structure shown in FIG. 11 respectively. It should be noted that the forming method shown in FIGS. 11 to 13 is substantially the same as the forming method shown in FIGS. 8 to 10 described above. Therefore, only the configuration of the memory structure is described below.

The difference between the process of forming the memory structure shown in FIG. 11 and the process of forming the memory structure shown in FIG. 8 is that the coverage range of the hard mask spacer 180" is larger than that of the hard mask spacer 180'. In FIG. 11, the hard mask spacer 180" covers two of the bit line structures immediately adjacent to the peripheral circuit region PA. In some embodiments, the bit line structure covered by the hard mask spacer 180" may be the dummy bit line structure (e.g., the dummy bit line structure 120').

The memory structure 100C shown in FIG. 12 is substantially similar to the memory structure 100A shown in FIG. 9. The difference between them is that the protective feature 171A" covers two of the bit line structures 120 (e.g., the dummy bit line structure 120') immediately adjacent to the peripheral circuit region PA. The protective feature 171A"disposed between the dummy bit line structure 120'and the dielectric layer 140'together with the dummy bit line structure 120' covered by the protective feature 171A" serve as a protective structure 190'. With the configuration of the protective feature 171A" with a larger coverage area and the top surface of the protective structure 190' being higher than the top surface of the bit line structure 120, it is more effective to avoid the acid liquid used to remove the excess film layer in the subsequent process (e.g., concentrated sulfuric acid) penetrating into the memory array region AA. Therefore, the reliability of the memory structure 100C is improved.

The memory structure 100D shown in FIG. 13 is substantially similar to the memory structure 100B shown in FIG. 10. The difference between them is that the two dummy bit line structures 120' immediately adjacent to the peripheral circuit region PA may be used as the protective structure. The top surface of the dummy bit line structure 120' served as the protective structure is higher than the top surface of the bit line structure 120". Furthermore, the two dummy bit line structures 120' form a double-protective structure. It is more effective to avoid the acid liquid used to remove the excess film layer in the subsequent process (e.g., concentrated sulfuric acid) penetrating into the memory array region AA. Therefore, the reliability of the memory structure 100D is improved.

It should be noted that the coverage range of the hard mask spacer and the protective structure (e.g., the number of dummy bit line structures included in the protective structure and/or the coverage area of the protective feature) disclosed in the embodiments of the present disclosure are merely exemplary. It may be adjusted according to the product design and the required acid resistance. It is not intended to be limiting.

To sum up, according to the method for forming the memory structure provided from the embodiments of the present disclosure, the hard mask spacer may be formed at the boundary between the memory array region AA and the peripheral circuit region PA without an additional etching mask. The process yield may be improved and the production costs may be reduced by utilizing the specific range of etching selective ratio to form the acid-resistant protective structure having the higher top surface. With the configuration of the protective structure described above, it can avoid the acid liquid used to remove the excess film layer in the subsequent process (e.g., concentrated sulfuric acid) penetrating into the memory array region. Therefore, the reliability of the memory structure is improved.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:
1. A memory structure, comprising:
 a substrate comprising a memory array region and a peripheral circuit region;
 a plurality of bit line structures disposed in the memory array region of the substrate;
 a dummy bit line structure disposed on the substrate, wherein the dummy bit line structure is disposed in the memory array region and immediately adjacent to the peripheral circuit region;
 a plurality of contacts disposed between the bit line structures and in the memory array region;

a dielectric layer disposed on the substrate and in the peripheral circuit region; and a protective structure disposed in the memory array region and immediately adjacent to the peripheral circuit region, wherein the protective structure comprises the dummy bit line structure and a top surface of the protective structure is higher than top surfaces of the bit line structures, wherein the protective structure further comprises a protective feature, wherein the protective feature is disposed between the dummy bit line structure and the dielectric layer.

2. The memory structure as claimed in claim 1, wherein a top surface of the protective feature is higher than the top surfaces of the bit line structures.

3. The memory structure as claimed in claim 1, wherein a top surface of the dummy bit line structure is higher than the top surfaces of the bit line structures.

4. The memory structure as claimed in claim 1, wherein a top surface of the protective feature is higher than the top surfaces of the dummy bit line structure.

5. The memory structure as claimed in claim 1, wherein the protective feature covers the dummy bit line structure.

6. The memory structure as claimed in claim 3, wherein a distance between the top surfaces of the bit line structures and a top surface of the dummy bit line structure is between 5 nm to 15 nm.

7. The memory structure as claimed in claim 1, wherein the substrate comprises gallium nitride (GaN), silicon carbide (SiC), gallium arsenide (GaAs), gallium phosphide (GaP), indium phosphide (InP), indium arsenide (InAs) and/or indium antimonide (InSb).

8. The memory structure as claimed in claim 1, wherein the dielectric layer comprises a silicon oxide layer.

9. The memory structure as claimed in claim 8, wherein the silicon oxide layer is formed of tetraethylorthosilicate (TEOS).

10. The memory structure as claimed in claim 1, wherein the dielectric layer comprises silicon nitride, silicon oxynitride, phosphosilicate glass (PSG), or borophosphosilicate glass (BPSG).

11. The memory structure as claimed in claim 1, wherein the dielectric layer comprises a low dielectric constant dielectric material.

12. The memory structure as claimed in claim 1, wherein the dielectric layer comprises a single or multiple layers of at least one of silicon oxide, silicon nitride, silicon oxynitride, phosphosilicate glass (PSG), borophosphosilicate glass (BPSG), and a low dielectric constant dielectric material.

13. The memory structure as claimed in claim 1, wherein a material of the contacts comprises polysilicon, metal, or metal nitride.

14. The memory structure as claimed in claim 13, wherein the material of the contacts comprises tungsten (W), aluminum (Al), copper (Cu), tungsten nitride (WN), titanium nitride (TiN), or tantalum nitride (TaN).

15. The memory structure as claimed in claim 1, wherein top surfaces of the contacts is lower than the top surfaces of the bit line structures.

16. The memory structure as claimed in claim 1, wherein the dielectric layer is formed by chemical vapor deposition (CVD), atomic layer deposition (ALD), and/or a combination thereof.

17. The memory structure as claimed in claim 1, wherein the contacts are formed by chemical vapor deposition (CVD), physical vapor deposition (PVD), or atomic layer deposition (ALD).

* * * * *